US008277602B2

(12) United States Patent
Dünnebeil et al.

(10) Patent No.: US 8,277,602 B2
(45) Date of Patent: Oct. 2, 2012

(54) APPARATUS AND METHOD FOR THE WET CHEMICAL TREATMENT OF A PRODUCT AND METHOD FOR INSTALLING A FLOW MEMBER INTO THE APPARATUS (75) Inventors: Sebastian Dünnebeil, Berlin (DE); Heinz Klingl, Neusäss (DE)

(73) Assignee: Atotech Deutschland GmbH, Berlin (DE)

( * ) Notice: Subject to any disclaimer, the term of this patent is extended or adjusted under 35 U.S.C. 154(b) by 342 days.

(21) Appl. No.: 12/602,722

(22) PCT Filed: Jun. 3, 2008

(86) PCT No.: PCT/EP2008/004617
§ 371 (c)(1),
(2), (4) Date: Dec. 15, 2009

(87) PCT Pub. No.: WO2008/148579
PCT Pub. Date: Dec. 11, 2008

(65) Prior Publication Data
US 2010/0176088 A1 Jul. 15, 2010

(30) Foreign Application Priority Data

Jun. 6, 2007 (DE) .................. 10 2007 026 635

(51) Int. Cl.
H01L 21/288 (2006.01)
C23C 18/31 (2006.01)
C23C 18/16 (2006.01)
(52) U.S. Cl. .................. 156/345.21; 156/345.11

(58) Field of Classification Search ............. 156/345.54, 156/345.1, 345.21, 345.33, 345.34, 345.11
See application file for complete search history.

(56) References Cited

U.S. PATENT DOCUMENTS

| 4,258,653 A | 3/1981 | Buzzell | |
|---|---|---|---|
| 4,752,371 A * | 6/1988 | Kreisel et al. | 204/297.1 |
| 4,964,498 A * | 10/1990 | Klingl | 198/347.1 |
| 5,375,926 A | 12/1994 | Omasa | |
| 6,630,052 B1 * | 10/2003 | Kim | 156/345.18 |
| 6,699,356 B2 * | 3/2004 | Bachrach et al. | 156/345.21 |
| 7,993,486 B2 * | 8/2011 | Hauf et al. | 156/345.2 |
| 8,062,471 B2 * | 11/2011 | Mikhaylichenko et al. | 156/345.37 |
| 2003/0155231 A1 | 8/2003 | Weng | |

(Continued)

FOREIGN PATENT DOCUMENTS

DE 10361880 B3 4/2005

(Continued)

OTHER PUBLICATIONS

Machine Generated English Translation of JP2004-162129 published Jun. 10, 2004.*

Primary Examiner — Sylvia R. MacArthur
(74) Attorney, Agent, or Firm — Paul & Paul (57) ABSTRACT To ensure a uniform flow over the surface of a product W, an apparatus is provided for the wet chemical treatment of the product W that is disposed in the apparatus 100. This apparatus comprises at least one flow member 150 that includes respectively at least one paddle-like flow element 155, wherein at least one flow member 155 is disposed situated opposite the surface of the product W and is moveable substantially parallel to the surface of the product W.

29 Claims, 4 Drawing Sheets

U.S. PATENT DOCUMENTS

| | | | |
|---|---|---|---|
| 2004/0217007 A1* | 11/2004 | Diel et al. | 205/101 |
| 2005/0178504 A1* | 8/2005 | Speh et al. | 156/345.21 |
| 2006/0141157 A1 | 6/2006 | Sekimoto et al. | |
| 2007/0012560 A1 | 1/2007 | Hauf et al. | |
| 2009/0039054 A1* | 2/2009 | Choi et al. | 216/24 |
| 2010/0176088 A1* | 7/2010 | Dunnebeil et al. | 216/83 |
| 2010/0200163 A1* | 8/2010 | Puggi et al. | 156/345.21 |

FOREIGN PATENT DOCUMENTS

| | | |
|---|---|---|
| JP | 08281272 | 10/1996 |
| JP | 2004162129 | 10/2004 |
| JP | 2005240108 | 8/2005 |

* cited by examiner

APPARATUS AND METHOD FOR THE WET CHEMICAL TREATMENT OF A PRODUCT AND METHOD FOR INSTALLING A FLOW MEMBER INTO THE APPARATUS

FIELD OF THE INVENTION

The present invention relates to an apparatus for the wet chemical treatment of a product that is disposed in the apparatus and a method for the wet chemical treatment of a product. In addition, the present invention relates to a method for installing a flow device into a treatment apparatus of this type. Such apparatuses and methods can be used both in the production of plate-shaped work pieces, such as printed circuit boards and printed circuit foils, semiconductor wafers, solar cells, photoelectric cells and monitor plates, and in the production of non-plate-shaped work pieces, which are provided with functional or decorative metal layers and are used, for example, in the sanitation industry, in automobile construction, the furniture industry, the jewellery and spectacles industry and in engineering.

TECHNICAL BACKGROUND

For the wet chemical treatment of work pieces, for instance for metal-coating or for etching, the work pieces are brought into contact with a treatment fluid, for example by immersion into a container containing the treatment fluid or by conducting a jet of the treatment fluid onto the surface of the work piece. The work pieces can be guided through a treatment system in a batch-wise manner or also by means of a continuous conveyor on which they are treated. During the treatment, the work pieces can be retained in an upright position or in a horizontal position. Printed circuit boards are, for example, typically treated either retained in the upright position in dip tanks or in a continuously operating system in which the work pieces are held in the horizontal position, being continuously conveyed. In the latter case, the treatment fluid can be kept in a stationary bath, the work pieces being guided through the said bath.

For wet chemical treatment it is typically advantageous for the treatment fluid to be set in motion during the treatment so that there is a sufficient fluid exchange on the surface of the work pieces to be treated and more especially in any small holes in the work pieces. Nozzles are used for this purpose, for example, the nozzle openings being disposed below the level of the fluid and conducting the fluid onto the surfaces of the work pieces. In addition, the fluid can also be set in motion by blowing air into the fluid.

The named measures for agitating the fluid have various disadvantages, the most important of which being that the movement of the fluid is too violent, which means that certain chemical processes, which ought to take place in the treatment fluid, do not take place or only take place insufficiently, and that the movement is frequently irregular, both as regards the time and the location. A strong influence on the fluid can result in its decomposition or at least in its damage.

To eliminate these disadvantages, U.S. Pat. No. 5,375,926 discloses an apparatus for mixing and distributing fluids in a container. The apparatus comprises a device generating oscillations, an oscillation shaft for the axial transmission of the oscillations generated by the device, at least one oscillating vane that is fastened to the oscillation shaft, and a mechanism for adsorbing the oscillations, which is disposed between the device generating the oscillations and a container. A plurality of oscillating vanes can be mounted on the shaft. The oscillating vanes are situated in a fluid in order to set the said fluid in motion.

In addition, Patent Abstracts of Japan to JP 08-281272A describes a device for treating liquid waste by means of electrolytic oxidation, for example, of used solution that has been used for the electroless deposition of nickel. The device includes three groups of electrode pairs, which are traversed by direct current. An agitating device that generates vibrations is disposed on one side of the electrode plates such that the flow in the fluid generated by the oscillations is interrupted by the groups of electrodes. To this end, an oscillating device is used where the oscillations of a vibration motor are transmitted to oscillating vanes by means of a retaining element. The vanes are inclined at an angle of 5°-30° relative to a plane that is perpendicular to the retaining element.

Further, US 2006/0141157 A1 discloses a plating apparatus for the treatment of a semiconductor wafer, this apparatus comprising an anode and a substrate holder holding the wafer. The apparatus additionally comprises a paddle (stirring rod) at a position facing a surface of the wafer and being disposed substantially vertically in the plating unit between the anode and the substrate holder. The paddle is configured to be moveable parallel to the wafer.

Further, US 2004/0217007 A1 discloses a method for plating comprising immersing a substrate, i.e., an article to form magnetic and non-magnetic materials that constitute the writing part of a read-write head, in a bath of plating solution and initiating an electrodeposition operation for depositing a layer of material on the substrate, the electrodeposition operation including agitating the bath and applying current to the substrate. Stirring is carried out by a reciprocating mixer which travels back and forth above the surface of the cathode at an approximate distance of 1/32 to 1/8 inch for providing agitation of the bath. The mixer is a paddle and has a pair of vertically elongate, triangular blades having spaced apart, parallel apexes defining there between a slot through which the fluid is flowable. The blades have oppositely facing, parallel, flat bases with one of the bases being disposed parallel to and closely adjacent to the substrate.

Further, US 2003/0155231 A1 discloses an electroplating apparatus comprising an electroplating bath, a pool of electrolytic solution inside the electroplating bath, a wafer immersed in the pool of electrolytic solution, a source metallic rod immersed in the pool of electrolytic solution, a regulation plate inside the electroplating bath in the space between the source metallic rod and the wafer and a paddle inserted in the space between the regulation plate and the wafer and immersed in the pool of electrolytic solution for mixing the electrolytic solution thoroughly.

Further, JP 2004162129 A relates to a plating apparatus and a method for enhancing the in-plane uniformity of the film thickness of a plating film by employing a dip system and adjusting the flow of plating solution in a plating tank. The apparatus comprises a plating solution injection nozzle to inject plating solution toward a surface to be plated of a work which is arranged perpendicularly inside the tank. The injection nozzle is disposed inside the tank and is disposed on a paddle which is disposed at the position facing the surface to be plated and moved along the surface to be plated to agitate the plating solution.

Finally, U.S. Pat. No. 4,258,653 discloses an apparatus for providing a dye density gradient to a web, the apparatus comprising a container which retains a dye bath, means for continually conducting the web longitudinally into the dye bath container and progressively transversely submerging the web in the dye bath and means for conducting the web out of the dye bath. The apparatus further comprises a frame of paddle with a plurality of paddles attached to the frame and means attached to the frame for moving the frame and the paddles in a reciprocating manner.

The known measures and devices for moving treatment fluid have various disadvantages: As already mentioned above, generating a movement in the fluid using the known devices and methods is very irregular which means that effects in the wet chemical treatment, which are dependent on the fluid flow, can be observed at different places and in different ways on the surface of the work piece. In addition, the generating of movements in the fluid using the known devices and methods, among other things, results in a very strong effect on the surface of the work piece, the said effect being restricted locally and/or only occurring sometimes. An efficient through-flow more especially of small holes is not possible by just using the known devices and methods. In addition, neither is it possible to obtain a flow over the surfaces of the work pieces in a targeted and controlled manner at a certain speed or in a certain direction. Moreover, the known devices and methods in many cases have the disadvantage of the mechanical structure being complex and consequently costly and requiring a large amount of energy for operation.

OBJECTS OF THE INVENTION

Consequently, it is one object of the present invention to find means with which a treatment fluid in wet chemical treatment can obtain a uniform effect on a product. More especially, one further object is to obtain uniformity of exposure to the product both with regard to timely constancy and also with regard to a uniform treatment over the entire surface of the product. In addition, it is one further object of the present invention to find means with which the effect can be adjusted in a controlled manner. In addition, one further object of the present invention is to obtain an efficient mass transfer both on the surface of the product and in small holes in the product and to this end, to flow through through-holes in an effective manner and to provide blind holes constantly with fresh fluid in an effective manner. Possible decomposition in the bath due to flow generation should be at a minimum. In addition, another object of the present invention is to guarantee a cost-effective construction of the means necessary for the achievement of the aforementioned objects and to ensure that only comparably small amounts of energy are required for the operation. In addition, another object of the present invention is to obtain the aforementioned requirements both for a conventional vertical mode of transport and for a continuous mode of transport where the product is guided either in an upright or in a horizontal position. Yet another object of the present invention is to find an apparatus and a method for the wet chemical treatment of a product, with which the aforementioned requirements are obtainable. And it is another object of the present invention to find a method by means of which conventional apparatuses for wet chemical treatment can be equipped with devices such that the aforementioned requirements are obtainable.

DESCRIPTION OF THE INVENTION

The said objects are achieved with the apparatus for the wet chemical treatment of a product that is disposed in the apparatus in accordance with claim 1, with the method for wet chemically treating the product in the apparatus in accordance with claim 19 and with the method for installing a flow member in the apparatus for wet chemical treatment in accordance with claim 22. Preferred specific embodiments of the invention are specified in the sub claims.

As far as the terms "disposed situated opposite the surface of the product", "situated opposite the surface of the product" or "disposed situated opposite the treatment plane" are used in the description below and in the claims, this refers to a spatial relationship between the object facing the surface of the product or respectively facing the treatment plane, where normal vectors extending from surface elements of the surface of the product or respectively of the treatment plane contact the object situated opposite, irrespective of whether any item is disposed between the product and the respective object or not.

As far as the term "treatment plane" is used in the description below and in the claims, this refers to a plane in the treatment apparatus, in which a substantially plate-shaped work piece is positioned. For example, one of the surfaces of the substantially plate-shaped work piece can coincide with the treatment plane, or the substantially plate-shaped work piece can be disposed in the treatment apparatus such that the treatment plane is disposed between the two surfaces of the work piece.

As far as the term "wet chemical treatment" is used in the description below and in the claims, this refers to a surface treatment, which is carried out using chemical fluids, for example chemical or electrolytic metal plating, chemical or electrolytic etching, chemical or electrolytic degreasing or anodising.

As far as the terms "product" and "work pieces" are used in the description and in the claims, these terms refer to objects which, in untreated form or in wet chemically treated form, are produced for various areas of application, for example, in circuit board technology (printed circuit boards, printed circuit foils), in wafer technology, for producing metal-coated glass plates or glass plates treated for other purposes, for instance windows, mirrors, monitor plates and collectors, photovoltaics (photoelectric cells) or in sensor technology (photosensitive cells). In addition, this not only refers to the plate-shaped objects, as being preferred according to the present invention, but also to variously shaped objects having a curved surface, for example. These types of work pieces are used, for example, in the sanitation industry, in automobile construction, in the furniture industry, in the jewellery and spectacle industry and in engineering, for instance for shower heads and sanitary fittings, furniture fittings, spectacle frames, jewellery, machine parts and engine blocks.

As far as the term "transversely relative to the path of movement" is used in the description below and in the claims, this refers to an arrangement of the object, where at least one of its surfaces is inclined at an angle of >0° to 90° relative to the path of movement. The path of movement is characterised by the distance that is covered by a flow member. In the case of strips that have a main plane (a plane coinciding with one of the main faces of the strips), the said main plane is inclined at the named angle relative to the path of movement.

The apparatus according to the invention for the wet chemical treatment of a product that is disposed in the apparatus comprises at least one flow member, which itself includes at least one paddle-like flow element. At least one flow member is disposed in the manner according to the invention situated opposite the surface of the product and is moveable substantially (≦±15°, for example) parallel to the surface of the product. The flow member serves to generate a flow of treatment fluid at the product surface. More preferably, it serves to ensure that the flow at the product surface is uniform.

The method according to the invention for the wet chemical treatment of a product that is disposed in a treatment apparatus includes the following method steps:
a. providing at least one flow member in the treatment apparatus, the said flow member respectively including at least one paddle-like flow element,
b. moving the flow member relative to the surface of the product,
c. disposing at least one flow member in such a manner in the apparatus such that it is situated opposite the surface of the product, and
d. moving the flow member substantially parallel ($\leq \pm 15°$, for example) to the surface of the product.

The following advantages can be achieved by using the apparatus according to the invention:

The flow is able to flow over all the regions of the surface of the product in a uniform manner more especially on account of the flow member being disposed in the apparatus in such a manner that it is disposed situated opposite the surface of the product and is moved substantially parallel ($\leq \pm 15°$, for example) to the surface of the product. Consequently, every point of a surface to be treated in a product is reachable in an identical manner by the flow.

In addition, the treatment fluid can be flown against all regions of the surface in a uniform manner in time average, more especially due to the fact that paddle-like flow elements are used on the flow members.

The invention also makes it possible to have the treatment fluid flow through small holes in a uniform manner, more especially small through-holes and blind holes. This is also achieved with the present invention due to the fact that there is a flow that is uniform in time average that reaches all the holes to the same extent.

In addition, more especially due to the fact that paddle-like flow elements are used, the treatment fluid is operated gently, such that, for example, it does not expel as much gas or it does not decompose as much as it might if nozzles fed by pumps were to be used.

In addition, more especially through the use of the paddle-like flow elements, it is possible to adjust the flow intensity and flow direction in a controlled manner.

In comparison to conventional nozzle flow, the use of a flow member with paddle-like flow elements is characterised by a mechanical design that is by far more cost-effective. Moreover, this design has a much smaller energy consumption compared to nozzle flow.

The invention additionally has a large area of application for conventional vertical technology (immersion), horizontal continuous mode and vertical continuous mode technology (for plates oriented upright that are transported on a horizontal path through the treatment stations). In addition, the invention is also suitable, in principle, for all treatment steps, including electrochemical treatment. A preferred application is the use of the apparatus and the method for electroless metal-coating, more especially for electroless copper-plating.

In order to obtain the advantageous effects, a conventional apparatus can be provided for wet chemical treatment by a flow member that comprises a paddle-like flow element being installed in a conventional apparatus or, for example, a conventional treatment apparatus which is provided in retro with a flow member of this kind. The following method steps are provided for this purpose:
i) providing the apparatus for the wet chemical treatment,
ii) installing at least one flow member into the apparatus such that the flow member is situated opposite the surface of the product and is moveable substantially parallel ($\leq \pm 15°$, for example) to the surface of the product.

According to an especially preferred embodiment of the invention, the product is plate-shaped and is disposed in a treatment plane in the apparatus. This type of plate-shaped product can be selected more especially from the group comprising printed circuit boards, printed circuit foils, semiconductor wafers, photoelectric plates and glass plates. In this case, at least one flow member is disposed situated opposite one side of the treatment plane and is moveable parallel ($\leq \pm 15°$, for example) to the treatment plane. In the case of the plate-shaped product, a particularly uniform treatment can be achieved because the flow member can be disposed in a suitable manner at the surface of the said product such that between the paddle-like flow elements and the surface of the product there is always a constant spacing.

In another preferred specific embodiment of the invention, whenever the product is plate-shaped, a flow member can be disposed on each side of the treatment plane.

In another preferred specific embodiment of the invention, at least one flow member is disposed such that it extends substantially parallel ($\leq \pm 15°$, for example) to the surface of the product.

In addition, a flow member can have at least two paddle-like flow elements, for example four, five, six, seven or eight flow elements. More especially, the flow elements can be disposed parallel to one another.

The path of movement of the flow member extends preferably parallel to the surface of the product. In the case of a plate-shaped product, the flow member is then moved along a straight path of movement. Even if the product is not plate-shaped, this path can run in a straight line, the path of movement in this case then being able to extend parallel to a main extension direction or plane of the product. In another specific embodiment according to the invention, the movement can take place in a path that extends parallel to the surface of the product, even if the surface is curved, which means that the path in this case is also curved. The path of movement naturally is not just able to extend in one direction but in two directions. Mixed forms of this variant are also possible.

The movement of a flow member can be variable and may preferably be a periodic movement. The movement can, however, also be uniform or jerky or have intervals. Vibrations are also possible. The movement of the flow member is preferably periodic, the frequency of the periodic movement preferably being in the range of from 0.02 to 100 Hz, especially preferably being in the range of from 0.1 to 10 Hz and most preferably being in the range of from 0.2 to 3 Hz. More generally, the lower limit of the frequency of movement of the flow member may be 0.02 Hz, more especially 0.1 Hz and most preferably 0.2 Hz and the upper limit of the frequency of movement of the flow member may be 100 Hz, more especially 10 Hz and most preferably 3 Hz, wherein each one of the lower limit values may be combined with any one of the upper limit values.

The speed of movement can be or vary in a range of from 1 to 1000 mm/s, more preferably from 10 to 1000 mm/s, even more preferably from 10 to 400 mm/s and most preferably from 30 to 200 mm/s. More generally, the lower limit of the speed of movement of the flow member may be 1 mm/s, more preferably 10 mm/s and most preferably 30 mm/s and the upper limit of the speed of movement of the flow member may be 1000 mm/s, more preferably 400 mm/s and most preferably 200 mm/s, wherein each one of the lower limit values may be combined with any one of the upper limit values.

The paddle-like flow elements of a flow member preferably extend transversely relative to the path of movement of the member.

In addition, a flow member according to the invention can be moved to and fro such that it is moved over the entire surface of the product (i.e., the surface of the product is completely covered by the flow member moving over the surface). I.e., every point on the surface of the product is passed by at least one flow element of a flow member at a preferably small spacing. A flow member is preferably shaped such that on account of the movement of the register within one movement cycle (=once to and fro), all regions of the plate are covered by a flow element as it is moved over the surface of the work piece at least once, preferably at least twice, especially preferred four times (with vertical projection onto the surface).

In addition, the movement of the flow member is preferably designed such that the maximum grid spacing between each of the flow elements of a flow member is as large as the overall distance covered by the member in the periodic movement in one direction of movement (for example a forward movement). In a particularly preferred specific embodiment of the invention, the maximum grid spacing between the flow elements of a flow member is as large as half the overall distance that the flow member covers in one direction of movement in a periodic movement.

In addition, the extension of the flow member from the first to the last flow element, determined in the direction of movement, is at least as great as the extension of the surface to be treated, also determined in the direction of movement, less double the amplitude, especially preferred less the amplitude (overall path in one direction of movement=2×amplitude).

In addition, the extension of the flow member, determined at right angles to the direction of movement, is preferably at least as great as the width of the surface of the product to be treated. If the product itself is to be moved with at least one movement component in this direction also, this additional path of movement of the product is to be added to the width of the flow member.

In place of a periodic movement (movement to and fro), at least one flow member can be configured so as to circulate in a path of movement, such that, in doing so, the flow member is moved over the entire surface of the product (i.e., the product is completely covered by the flow member as it moves over the surface of the work piece). In this case, the flow member can, for example, be designed similarly to a conveyor belt such that a continuous movement of flow elements that are fastened on the conveyor belt takes place. A path of the conveyor belt extends preferably parallel to the surface of the product. The conveyor belt itself can be permeable to fluid or also impermeable to fluid.

In addition, at least one paddle-like flow element of a flow member can be rigidly retained. For example, the flow elements can be rigidly connected to a frame.

In an alternative specific embodiment of the invention, at least one paddle-like flow element of a flow member can be moveable, for example pivotable or simply flexible and thus moveable. The flow elements can be moveably connected to a frame for this purpose, for example by being fastened to the frame by means of a pivot joint. In order to compensate in this case for the lengthened path of deflection of the flow elements when the flow member moves to and fro when pivoting, the path of movement of the flow member should be lengthened by the path of deflection of the flow elements relative to a flow member where the flow elements are rigidly retained. When the flow elements are moveable, it is possible to influence flow direction and shape and intensity of the flow in the treatment fluid.

In a further development of the aforementioned specific embodiment according to the invention, the paddle-like flow element is moveable, e.g., pivotable, against a stop member. This means that the deflection of the flow elements is defined during the movement to and fro. For example, the stop member can serve to define the deflection onto a pivotal sector that extends to a range of from 0° to 90° relative to the path of movement, i.e., to a quarter circle (pivotal) movement.

In principle, the flow elements can be rigid, i.e., substantially rigid to bending and distortion, which means that their shape does not change when the flow member moves. On the other hand, however, the flow elements can also be developed so that they do bend and/or distort when they move. For this purpose, resilient elements (for example lamellae) can be used, for instance by having a thin cross-section. In an alternative specific embodiment of the invention, the elements can also be made from a resilient material.

In another preferred manner, when flow members are disposed on both sides of the surface of a plate-shaped product, the flow members can be disposed on both sides of the treatment plane such that the paddle-like flow elements of different flow organs are offset from one another, for example staggered. This is especially advantageous for the treatment of plate-shaped products that include through-holes. In an alternative embodiment of the invention the flow members being disposed on both sides of the surface of a plate-shaped product may also be disposed on both sides of the treatment plane such that the paddle-like flow elements of different flow organs are disposed directly opposite to each other.

If, moreover, in the last case, the paddle-like flow elements have convexly formed end faces that face the surface of the product, a particularly effective through-flow, even of small holes, can be achieved. This is accomplished in that the flow elements, by moving along the surface of the product with their end faces, generate a flow in the direct vicinity of the surface and, at the side of the end face, this results in static pressure that is lower than the one prevailing between two adjacent flow elements. By offsetting the flow elements, for example, at the two surfaces of the plate-shaped product, there is a local drop in pressure along the axis of through-holes and this leads to improved flow through the holes (Bernoulli effect).

In a particularly preferred specific embodiment of the invention, the flow elements are selected from the group comprising strips and pins. Strips are more especially characterised by a flat cross-section and an elongated form. Consequently, strips have a main plane.

If strips are used, they can be mounted at the flow member such that their respective main planes extend transversely, preferably at an angle of 90°, relative to the path of movement of the flow member. In principle, however they can be disposed inclinedly relative to the path of movement. In addition, the strips are also preferably disposed upright with reference to the surface of the product. They can also be disposed inclinedly (<90°) relative to the surface of the product, for example to generate a specific direction of flow.

In a basic specific embodiment of the present invention, two flow members are provided for the treatment of a plate-shaped product in a treatment apparatus, the said two flow members including strips as flow elements and having one on each side of the product. Each flow member, in this especially preferred specific embodiment, consists of strips disposed in parallel, the wide side of which being orientated vertically to the surface of the product and the longitudinal side perpendicular to the path of movement. The strips are fastened to a frame, which is moved by means of a drive.

The strips preferably include a substantially rectangular horizontal projection. Consequently, in their simplest embodiment the strips are provided over their entire length with an identical rectangular cross-section. The strips can be continuous over the entire width or can be made of individual strips.

The strips can admittedly also have different cross-sections: Apart from a rectangular cross-section, it can also be trapezoidal, triangular or round. The cross-section can more especially be round or rounded at the end faces of the strips that face the surface of the product.

The thickness of the strips can be from a few micrometers to a few centimeters (e.g., 10 cm) depending on the material and on the desired shape, for instance to realise specific characteristics. The width of the strips can be from a few millimeters to a few decimeters depending on the requirement. The number of strips in one flow member can be selected within a wide range, for example from 1 to 10,000, preferably from 3 to 100, especially preferred from 5 to 25. In general, the lower limit of the number of strips may be 1, more preferably 3 and most preferably 5 and the upper limit of the number of strips may be 10,000, more preferably 100 and most preferably 25, wherein each one of the lower limit values may be combined with any one of the upper limit values.

The spacing between the strips in a flow member can be constant. However, the spacing can also be different from strip to strip. It can be or vary in a range of from 1 to 500 mm, preferably from 3 to 250 mm, especially preferred from 10 to 150 mm. In general, the lower limit of the spacing between adjacent strips may be 1 mm, more preferably 3 mm and most preferably 10 mm and the upper limit of the spacing between adjacent strips may be 500 mm, more preferably 250 mm and most preferably 150 mm, wherein each one of the lower limit values may be combined with any one of the upper limit values. It can be particularly favourable for the spacing between two strips to be equal to the amplitude of the periodic movement of the flow member (±10%).

All materials that are resistant to the treatment fluid can be used for the strips, preferred are plastics materials, especially preferred are unpigmented plastics materials.

The paddle-like flow elements, more especially strips, can be disposed at a spacing from the surface of the product in a range of from 0 to 500 mm, preferably of from 1 to 100 mm and especially preferred of from 3 to 50 mm. In general, the spacing between the paddle-like flow elements and the surface of the product may be at least 0 mm or at least 0.5 mm, more preferably at least 1 mm and most preferably at least 3 mm. It may be at most 500 mm, more preferably at most 100 mm and most preferably at most 50 mm. The spacing may be in a range of any combination of a lower value as being given and an upper value as being given. Normally the spacing between the surface of the product and the paddle-like flow elements, more especially strips, is constant during treatment, more especially when plate-shaped products are being treated. However, varying spacings are also conceivable. In one embodiment the flow elements can also contact the surface.

In addition, the paddle-like flow elements, more especially strips, can be structured on the side that faces the surface of the product. For example profiled paddle-like flow elements, more especially strips, can be used: Thus the flow elements, especially strips, can include recesses on the side that faces the product surface to be treated, which means that the appearance is comb-like. This produces an improvement in the uniformity and efficiency of the flow on the product. In addition or as an alternative, there can also be holes in the paddle-like flow elements, more especially strips, the said holes also influencing the flow conditions.

The width of the teeth can be in a range of from 1 to 100 mm, preferably from 10 to 30 mm. In general, the lower limit of the width of the teeth can be 1 mm and more preferably 10 mm and the upper limit of the width of the teeth can be 100 mm and more preferably 30 mm, wherein each one of the lower limit values may be combined with any one of the upper limit values. The spacing between teeth (width of the recesses) can be in a range of from 1 to 100 mm, preferably from 10 to 30 mm. In general, the lower limit of the spacing between adjacent teeth may be 1 mm and more preferably 10 mm and the upper limit may be 100 mm and more preferably 30 mm, wherein each one of the lower limit values may be combined with any one of the upper limit values. The recesses in adjacent flow elements can also be offset against each other. The recesses in flow elements being located at the front and back of the work piece, respectively, can also be offset against each other.

The recesses can be rectangular, triangular or round, for example preferably semi-circular. Other forms are also conceivable. The width of the teeth on one flow element, more especially strip, or the width of teeth on different flow element, more especially strip, can always be identical or can differ. This also applies equally to the recesses between the teeth. In addition, the end faces that face the product surface to be treated may be designed such that certain flows are realised, for example flows that correspond to the Bernoulli principle.

If pins and small paddles are used as flow elements, they can preferably be disposed in a flow member in a matrix-like manner.

The flow members can be driven pneumatically or electromechanically, jointly or individually and can also be coupled to another movement.

The flow members preferably include a frame for the retaining of the flow elements. At the back a flow member is preferably open so as not to impede the circulation of the fluid there. However, the flow member can also be closed at the back.

If plate material, more especially foil-type material, is to be treated, it is important that it is disposed in a flat plane to guarantee a constant spacing between it and the flow member. To this end, it can be grasped at its lateral edges and, where applicable, can additionally be tensioned. Suitable retaining elements can be used for this purpose.

A flow member, comprising a paddle-like flow element can be disposed in the electrolytic cell between the product and the counter electrode, an anode for example. For the construction thereof it is to be paid attention to avoid screening off of the electric field lines, because such screening would lead to undesired differences in plating thickness. The prevention of the screening off of electric field lines may be achieved, on the one hand, by blurring or evening out the screening effect through the movement of the product relative to that of the flow member. In doing so the product and flow member may also be moved at the same time. The product and the flow members should in this case be moved relative to each other such that uniformity of the electric field lines is achieved both with respect to time levelling and spatial levelling of plating action. On the other hand, the parts located between the product and the anode can be designed so as to be as thin as possible. This measure and the aforementioned measure may be realized alternatively or may both be realized. In another embodiment the flow members may be disposed behind the anodes (as seen from the product). In this case the treatment fluid flows from the flow member to the product by passing through the counter electrodes.

The material can be retained in a rigid manner, i.e., without being moved. However, the material can also be moved in the fluid, for instance vertically or parallel, for example in the shape of a circle, towards the surface of the product or vertically or parallel to its direction of main extension or -plane. As an alternative it can also be moved in two of the named directions at the same time.

In the case of vertical systems, in which the plate-shaped product is treated and for that purpose is immersed in the treatment fluid, the said retaining elements can be, for example, retaining strips, which retain the product laterally at the edges. Retaining elements can more especially be retained on a support frame, which, for example, can be moved to and fro to move the product in the fluid. The flow members can be mounted on an oscillation frame, which, in its turn, can be retained by the support frame in order to move the said flow members also relative to the product. To this end, the oscillation frame can be moved relative to the support frame. In a special specific embodiment of the invention, the support frame moves the oscillation frame such that the movement, which the flow members experience, is a superimposition of the movements of the product and of the additional relative movement towards the product. In principle, each mixed form of moved product and moved flow members is possible.

More especially preferred is a combination between a product movement vertically relative to the product surface or vertically relative to the main extension direction or plane of the product and a movement of the flow members in one direction parallel to the surface of the product or parallel to the main extension direction or plane of the product. The spacing between a flow member and the surface of the product can be constant in this case. The latter can more especially be accomplished in that the product moves vertically relative to the treatment plane and at the same time the at least one flow member is moved, at a constant spacing to the product, parallel thereto.

In order to set the treatment fluid in motion additionally, air can also be blown in, for example, to stabilise the bath. It can be advantageous, in this case, to direct the air into the treatment fluid behind the flow member, that is, not between the flow member and the surface of the product.

The product is preferably grasped by fingers to retain it in position. The number and shape of the fingers should be such that the flow is not impaired in any way. They should be narrow, for example.

For the treatment of plate-shaped material with small holes, where necessary, an additional nozzle register can be mounted preferably below the bath level to wet the holes and other fine structures, such as on printed circuit boards, when the material is introduced into the treatment bath.

It is generally considered that flow breakers can be installed in the treatment apparatus in order to suppress a build up of fluid movement during the treatment, which can be caused by the movement of the fluid through a flow member, and in order to obtain improved, defined flow conditions. The said flow breakers can be, for example, strips.

Electrodes, for example anodes that are resistant (dimensional stable) to the treatment agent, can be disposed between, behind and/or in front of the flow elements.

In treatment apparatuses in which horizontally orientated plates are transported horizontally for the treatment, strip registers, for example, as flow members can be disposed on one or both sides of the transport plane between two transport members, such as, for example, carrier rollers or wheels. The registers can then move parallel to the transport plane.

DESCRIPTION OF THE DRAWINGS

The following figures serve to explain the invention in more detail. They are as follows.

Identical reference numbers identify the same elements in all the figures.

Figure 1:
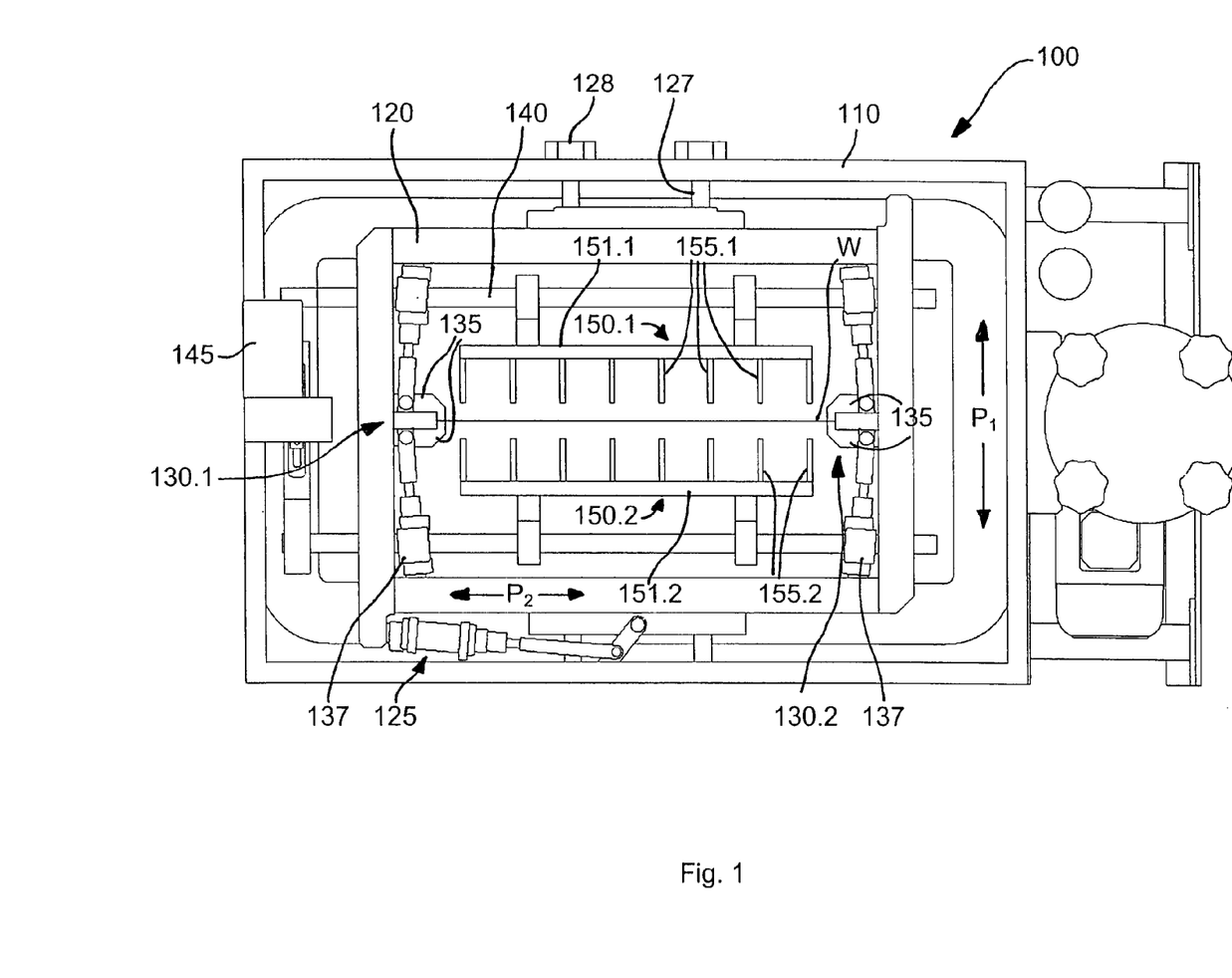
FIG. 1 is a view of a treatment apparatus with two flow members.

The treatment apparatus 100 comprises an accommodating frame 110. The said accommodating frame 110 is a component part of a basic frame 105 that is shown in more detail in FIG. 2. The accommodating frame 110 serves for retaining a container 200 (shown in FIG. 2), in which treatment fluid is situated and in which an electroplating treatment takes place. The accommodating frame 110 is made, for example, from sturdy profiled sections, preferably made from metal. It can be fixedly or detachably connected to the rest of the basic frame 105. FIG. 1 shows a view into the interior of the treatment apparatus 100. It is also possible to recognise a support frame 120, which is situated partially above a work piece W that is located in the container and runs round the end region of the container 200. The support frame 120 serves to retain retaining devices 130 (130.1, 130.2), which in their turn retain the work piece W, and an oscillation frame 140, which serves to retain various components. The support frame is moved to and fro parallel to the arrow $P_1$. Consequently, all the apparatus components and consequently also the work piece W are also entrained synchronously with this movement. The said movement is accomplished by means of a drive 125, for example a pneumatic cylinder, which is supported on the accommodating frame 110. The support frame 120 is moved on rails 127, which are precisely positioned by means of adjusting devices 128, on a defined path. Pneumatic cylinders for the drive 125 are small and, compared to a motor drive, unsusceptible to fluids and vapours found typically in an electroplating container between the surface of the bath and the cover. In addition, they are cost-effective. Over and above this, they make it possible to adjust the driven support frame 120 in a defined manner.

As the support frame 120 also retains the oscillation frame 140, this latter, just as the support frame 120, is moved to and fro parallel to the arrow $P_1$. In addition, the oscillation frame 140 is moved to and fro by means of another drive 145 in a direction that extends vertically to the movement direction $P_1$ of the support frame 120. This direction of movement is indicated by the additional arrow $P_2$. The drives 125 and 145 for the support frame 120 or respectively the oscillation frame 140 are driven pneumatically or by an electric motor.

In the interior of the container 200 there is a work piece W, for example a printed circuit board. This work piece W is retained by retaining devices 130 (130.1, 130.2) in vertical orientation in the container 200. The retaining devices 130 grasp the work piece W in its respective end regions. FIG. 1 shows two retaining devices 130, namely a first retaining device 130.1, which grasps the left edge of the work piece W, and a second retaining device 130.2, which grasps the right edge of the work piece W. The retaining devices 130, just as the work piece W, are retained in vertical orientation in the container. The retaining devices 130 each comprise two clamping finger groups 135, which, when clamping the work piece W, rest on the respective edge. The clamping finger groups 135 are each pivotable about a pivot point. Consequently they can be pivoted into an open position and into a clamping position. Drives 137 which each actuate a clamping finger group 135 are provided for this purpose. The said drives are also pneumatically opened and closed or opened under the effect of pneumatic force, whilst the closing force is applied by means of a pre-biased spring. The closing force is maintained in this case even if the power supply is interrupted.

The retaining devices 130 are retained by the support frame 120. This means that the retaining devices 130, consequently also the clamping finger groups 135 and finally the work piece W, are retained in constant movement parallel to the direction of arrow $P_1$ by the movement to and fro of the support frame 120.

Flow members 150 (150.1, 150.2) are provided in a manner according to the invention on both sides of the work piece W in the container 200 and are retained by the oscillation frame 140. As the oscillation frame 140 is moved in constant movement both in the direction of arrow $P_1$ and in the direction of arrow $P_2$, the said flow members 150 are also continuously moved in these directions. As the deflection of the movement in the direction of arrow $P_1$ corresponds to that of the support frame 120 and consequently of the work piece W and as the deflection of the movement in the direction of arrow $P_2$ extends parallel to the surface of the work piece, the respective spacings between the two surfaces of the work piece W and the two flow members 150 always remain constant. In addition, there is a relative movement between the flow members 150 and the work piece W parallel to their surfaces such that a uniform treatment on the two surfaces of the work piece can be achieved.

Each of the two flow members 150 comprises a frame 151 (151.1, 151.2) and flow elements 155 (155.1, 155.2). The flow elements 155 are strips with a rectangular cross-section. The strips 155 are fastened to the respective frame 151 and are aligned vertically relative to the surface of the work piece W. The strips 155 end in respective end faces where the strips 155 face the work piece surfaces. The spacing between the end faces of the strips 155 and the respective work piece surface (in the present case the work piece W being a plate) can be selected to be relatively small without having to fear that the end faces of the strips 155 may collide with the work piece surfaces when the flow members 150 are moving.

The flow members 150 are set into a relative swinging movement parallel to the work piece W by the movement of the oscillation frame 140. As the end faces of the strips 155 of the flow members 150 are disposed relatively closely to the surfaces of the work piece, for example at a spacing of from 0.5 to 5 cm, when the flow members 150 move parallel to the work piece surfaces, a fluid flow is generated in the immediate surroundings of the work piece surfaces, the said flow having a strong component parallel to the surfaces and having additionally, by turbulences being easily formed in the region of the strips 155, movement components vertically to the work piece surfaces. As the strips 155 completely cover (i.e., move over) at least one useful region on the work piece surfaces when they move, a very uniform wet chemical treatment is achieved in this region.

The side view of the treatment apparatus 100 (FIG. 2) shows the base frame 105, one part of which is the accommodating frame 110, which is situated in the upper region of the treatment apparatus 100 for retaining, for example, the container 200. To this end, an accommodating profile 115 is provided on the accommodating frame 110, the said accommodating profile engaging in the beading of the container 200. The container 200 consequently hangs in the accommodating frame 110.

Figure 2:
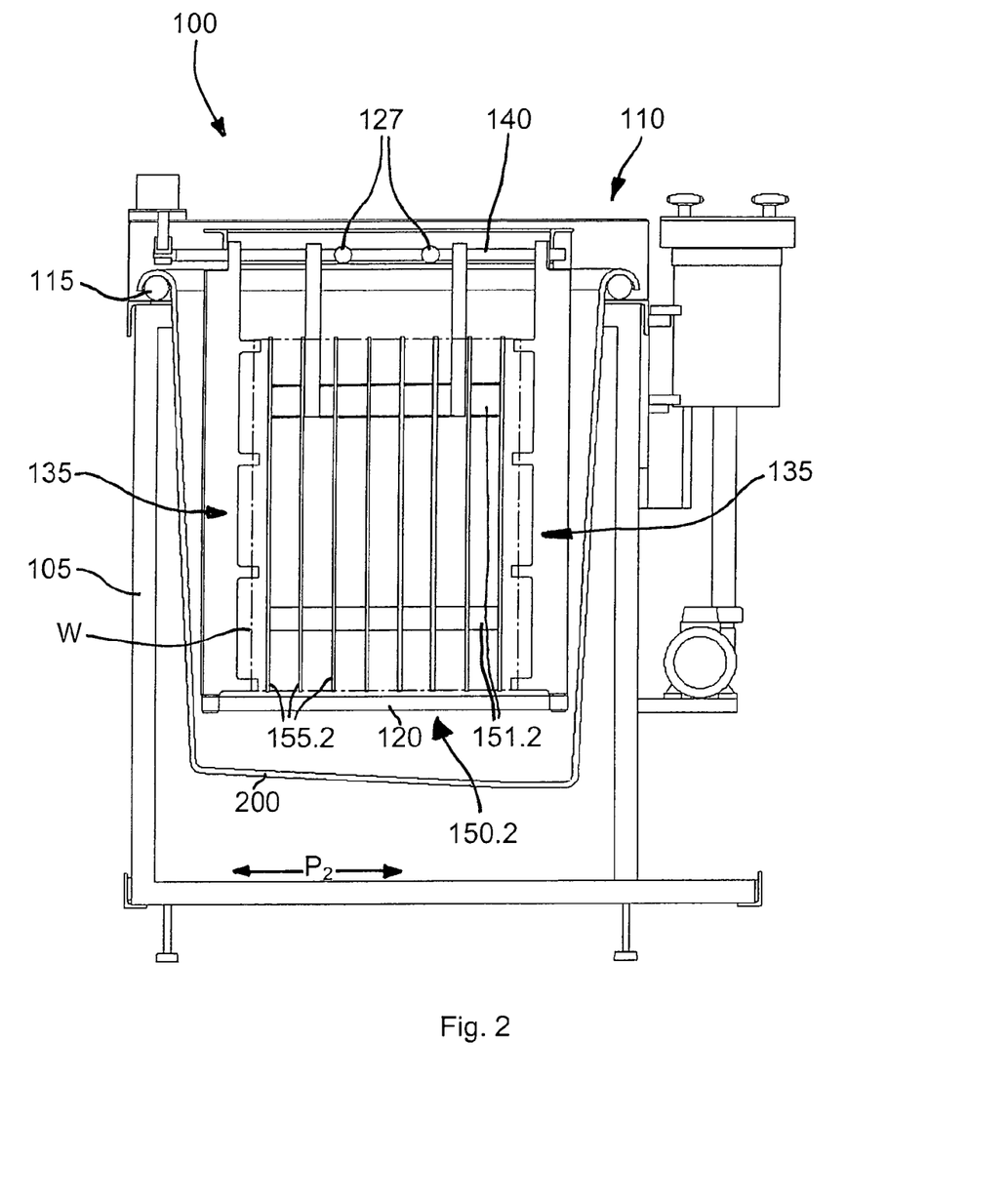
FIG. 2 is a side view of the treatment apparatus in FIG. 1.

In addition, on the accommodating frame 110 the support frame 120 is fastened to the rails 127 by means of the guide. Consequently, the thermal expansion of the container 200 cannot effect the positioning of the support frame 120 and consequently other components of the apparatus 100. The retaining devices, represented in this case by the clamping finger groups 135, are fastened to the support frame 120. In addition, the oscillation frame 140, which additionally moves to and fro parallel to the drawing plane, is shown. A work piece W, for example a printed circuit board, is grasped by the clamping finger groups 135 at its side edges.

A flow member 150 that is disposed in the container 200 is also shown (only the flow member 150.2 that is disposed in front of the work piece W is shown in this case). The flow members 150 are disposed parallel to the work piece surface and are retained on the oscillation frame 140. The oscillation frame 140 retains the frame 151, which in its turn retains the flow elements (strips) 155. The frame 151, in the present case, simply comprises crossbars that retain the strips 155.

The strips 155 are disposed vertically relative to the work piece surface and also upright in the container 200. As the oscillation frame 140 holding the flow members 150 is moved parallel to the drawing plane and consequently also parallel to the surface of the work piece (see arrow $P_2$), the flow members 150 are also moved parallel to the surface of the work piece. Consequently, a flow is created in the treatment fluid in regions directly at the work piece surfaces, the said flow having movement components substantially parallel to the surfaces and additionally having components at right angles thereto.

Figure 3:
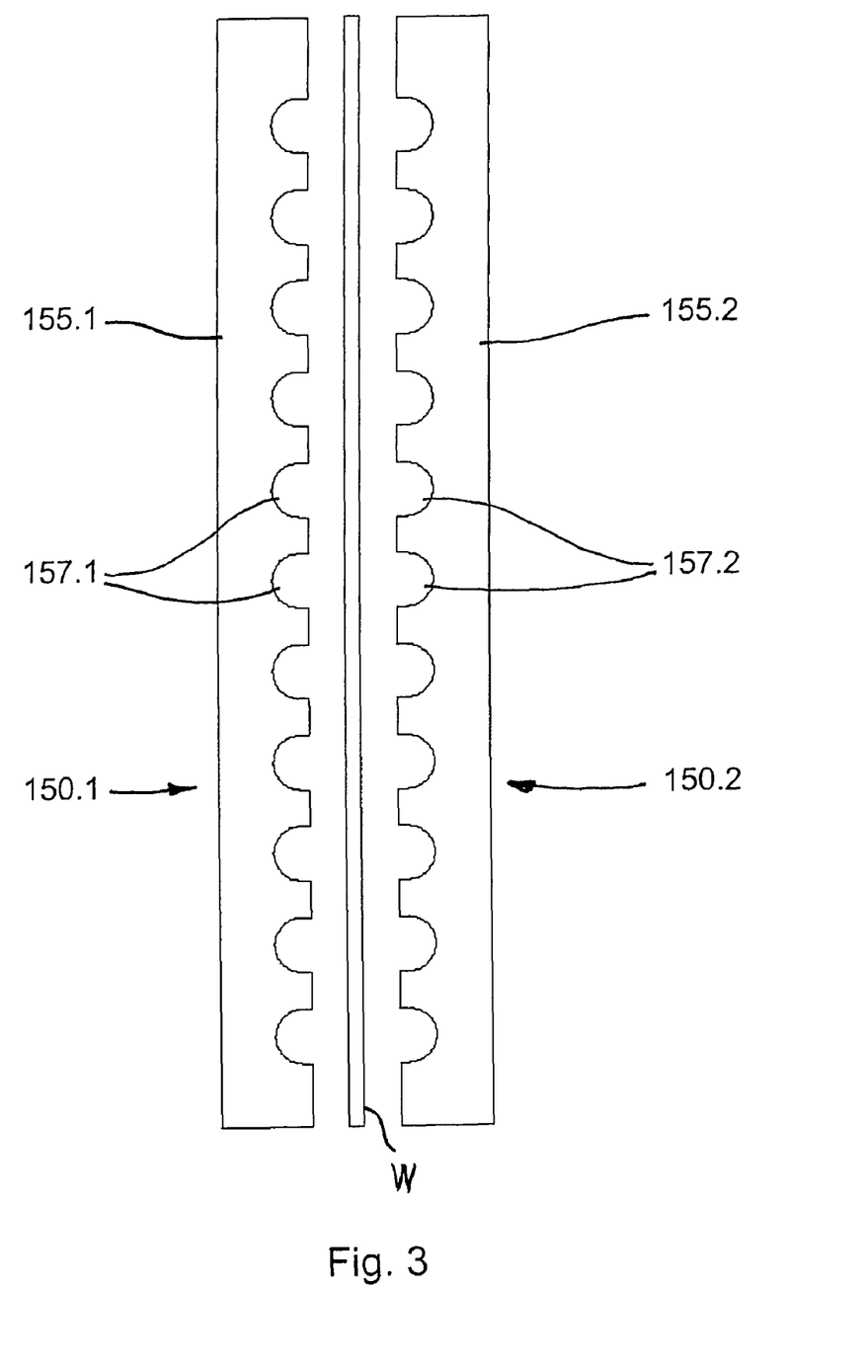
FIG. 3 is a detailed view of two flow members at the surfaces of a plate-shaped work piece.

FIG. 3 is a detailed representation of a side view of a work piece W with two flow members 150 (150.1, 150.2) that are disposed situated opposite the work piece surfaces. The end faces of the strips 155 (155.1, 155.2) extend almost to the surfaces of the work piece. The frames of the said flow members 150 are not shown. In this specific embodiment, the strips 155 (155.1, 155.2) include recesses 157 (157.1, 157.2) on the end faces that face the work piece surfaces. The said recesses 157 are semi-circular in the present case. When the strips 155 move parallel to the work piece surfaces (i.e. in the drawing plane), turbulences are formed in the region of the end faces of the strips 155 structured by the recesses and this leads to a increased flow in the region of the work piece surfaces.

Figure 4:
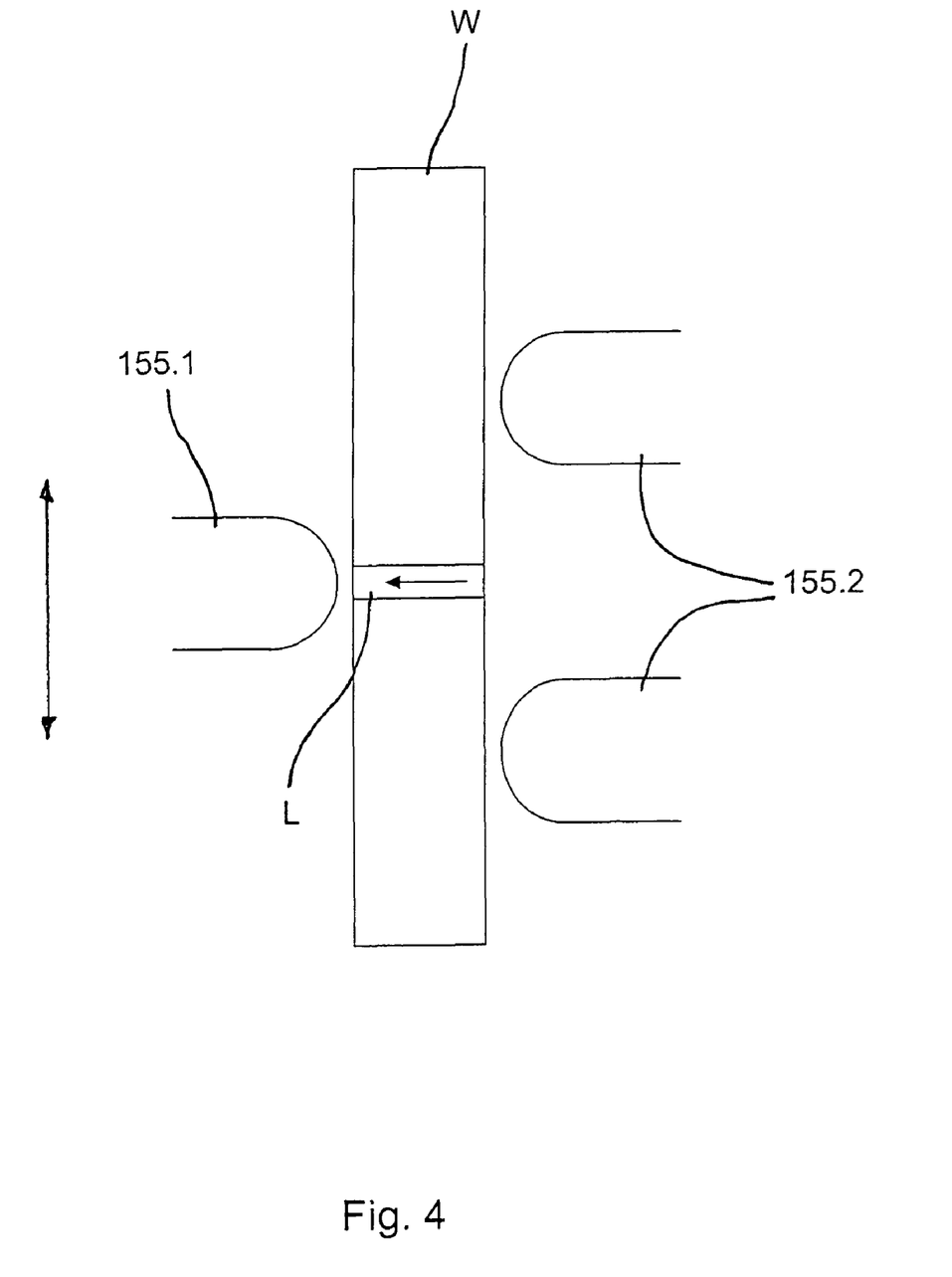
FIG. 4 is a sectional representation of a side view of a treatment apparatus with flow strips.

FIG. 4 shows a detail of an arrangement with flow members disposed on both sides of a plate-shaped work piece W, only its flow strips 155 (155.1, 155.2) that are offset one relative to another being shown in this case. The flow members are guided in the directions indicated by the double arrow along the surfaces of the work piece W. A flow element 155.1 passes a through-hole L in the work piece W for the moment and consequently generates a negative pressure in the hole L. This induces a flow in the hole L along the arrow shown here.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. Apparatus for the wet chemical treatment of plate-shaped products (W) disposed in a treatment plane in the apparatus (100), the said apparatus (100) comprising at least one flow member (150) that each comprises at least one paddle-like flow element (155), characterised in that at least one flow member (150) is disposed situated opposite the surface of the product (W) and is moveable substantially parallel to the surface of the product (W), characterised in that each flow element includes a side that faces the surface of the product (W) and that the said side is structured to form a profile of at least one of recesses and holes.

2. Apparatus for the wet chemical treatment according to claim 1, characterised in that the flow member (150) is moved relative to the product (W) at a speed of from 10 to 400 m/s.

3. Apparatus for the wet chemical treatment according to claim 1, characterised in that the flow member (150) is disposed at a spacing from the surface of the product of at least 3 mm and at most 100 mm.

4. Apparatus for the wet chemical treatment according to claim 1, characterised in that the product (W) is selected from the group comprising printed circuit boards, printed circuit foils, semiconductor wafers, photoelectric plates and glass plates.

5. Apparatus for the wet chemical treatment according to claim 1, characterised in that a flow member (150) is disposed on each side of the treatment plane.

6. Apparatus for the wet chemical treatment according to claim 5, characterised in that the flow members (150) are disposed on both sides of the treatment plane such that the paddle-like flow elements (155) of different flow members (150) are offset against one another.

7. Apparatus for the wet chemical treatment according to claim 1, characterised in that at least one flow member (150) is disposed such that it extends substantially parallel to the surface of the product (W).

8. Apparatus for the wet chemical treatment according to claim 1, characterised in that a flow member (150) comprises at least two paddle-like flow elements (155), and in that the flow elements (155) are disposed parallel to each other.

9. Apparatus for the wet chemical treatment according to claim 1, characterised in that at least one flow member (150) is moveable in a path of movement and in that the paddle-like flow elements (155) extend transversely relative to the path of movement.

10. Apparatus for the wet chemical treatment according to claim 1, characterised in that at least one flow member (150) is moveable to and fro such that the surface of the product (W) is completely coated.

11. Apparatus for the wet chemical treatment according to claim 1, characterised in that at least one flow member (150) is designed so as to circulate in a path of movement such that the flow member is moved over the entire surface of the product (W).

12. Apparatus for the wet chemical treatment according to claim 1, characterised in that at least one paddle-like flow element (155) of a flow member (150) is rigidly retained.

13. Apparatus for the wet chemical treatment according to claim 1, characterised in that at least one paddle-like flow element (155) of a flow member (150) is pivotable.

14. Apparatus for the wet chemical treatment according to claim 1, characterised in that the paddle-like flow elements (155) comprise convexly formed end faces that face the surface of the product (W).

15. Apparatus for the wet chemical treatment according to claim 1, characterised in that the paddle-like flow elements (155) are designed such that they bend during movement.

16. Apparatus for the wet chemical treatment according to claim 1, characterised in that the paddle-like flow elements (155) are selected from the group comprising strips and pins.

17. Apparatus for the wet chemical treatment according to claim 16, characterised in that at least one flow member (150) is moveable in a path of movement and comprises at least one strip (155) that comprises a main plane and in that the main planes of the strips (155) extend transversely relative to the path of movement of the flow member (150).

18. Apparatus for the wet chemical treatment according to claim 16, characterised in that the paddle-like flow elements (155) are structured on the side facing the surface of the product (W) to form a profile of at least one of recesses and holes.

19. Method for installing a flow member (150) into an apparatus (100) for the wet chemical treatment of a product (W) that is disposed in the apparatus, wherein the flow member (150) includes at least one paddle-like flow element (155), the said method comprising the following method steps:
   i. Providing the apparatus (100) for the wet chemical treatment according to claim 1,
   ii. installing the flow member (150) into the apparatus (100) such that the flow member (150) is situated opposite the surface of the product (W) and is moveable substantially parallel to the surface of the product (W).

20. Apparatus according to claim 1, characterised in that the product (W) is moved vertically relative to the treatment plane and in that at the same time the at least one flow member (150) is moved at a constant spacing from the product (W) parallel thereto.

21. Method for the wet chemical treatment of a product (W) that is disposed in a treatment apparatus (100), the said method comprising the following method steps:
   a. providing at least one flow member (150) in the treatment apparatus (100), the said flow member respectively comprising at least one paddle-like flow element (155);
   b. disposing at least one flow member (150) in the apparatus (100) opposite the surface of the product (W); and
   c. moving the flow member (150) relative and substantially parallel to the surface of the product (W);
   characterised in that each flow element (155) includes a side that faces the surface of the product (W) and that the said side is structured to form a profile of at least one of recesses and holes, and in that the flow member (150) includes at least two flow elements (155) and that the at least two flow elements (155) are located at varying spaces to the surface of the product (W), and that when the product (W) is plate-shaped, a flow member (150) is disposed on each side of said plate-shaped product (W) and that the paddle-like flow elements of the flow members (150) on the both sides of the plate-shaped product (W) are offset from one another.

22. Method for the wet chemical treatment according to claim 21, characterised in that at least one flow member (150) is moved to and fro, such that the flow member moves of the entire surface of the product (W).

23. Method for the wet chemical treatment according to claim 21, characterised in that at least one flow member (150) circulates in a path of movement such that the flow member moves over the entire surface of the product (W).

24. Method for the wet chemical treatment according to claim 21, characterized in that the flow member (150) is moved at a speed of from 10 to 400 mm/s.

25. Method for the wet chemical treatment according to claim 21, characterized in that the flow member (150) is disposed at a spacing from the surface of the product (W) of at least 3 mm and at most 100 mm.

26. Apparatus for the wet chemical treatment of plate-shaped products (W) disposed in a treatment plane in the apparatus (100), the said apparatus (100) comprising at least one flow member (150) that each comprises at least one paddle-like flow element (155), characterised in that at least one flow member (150) is disposed situated opposite the surface of the product (W) and is moveable substantially parallel to the surface of the product (W), characterised in that the flow member (150) includes at least two flow elements (155) and that the at least two flow elements (155) are located at varying spaces to the surface of the product (W).

27. Apparatus for the wet chemical treatment of plate-shaped products (W) disposed in a treatment plane in the apparatus (100), the said apparatus (100) comprising at least one flow member (150) that each comprises at least one paddle-like flow element (155), characterised in that at least one flow member (150) is disposed situated opposite the surface of the product (W) and is moveable substantially parallel to the surface of the product (W), characterised in that a flow member (150) is disposed on each side of the plate-shaped product (W) and that the paddle-like flow elements (155) of the flow members (150) on the both sides of the plate-shaped product (W) are offset from one another.

28. Apparatus for the wet chemical treatment of plate-shaped products (W) disposed in a treatment plane in the apparatus (100), the said apparatus (100) comprising at least one flow member (150) that each comprises at least one paddle-like flow element (155), characterised in that at least one flow member (150) is disposed situated opposite the surface of the product (W) and is moveable substantially parallel to the surface of the product (W), and characterised to include at least one of the following:
   a. in that each flow element includes a side that faces the surface of the product (W) and that the said side is structured to form a profile of at least one of recesses and holes,
   b. in that the flow member (150) includes at least two flow elements (155) and that the at least two flow elements (155) are located at varying spaces to the surface of the product (W),
   c. in that a flow member (150) is disposed on each side of the plate-shaped product (W) and that the paddle-like flow elements (155) of the flow members (150) on the both sides of the plate-shaped product (W) are offset from one another.

29. Method for the wet chemical treatment of a product (W) that is disposed in a treatment apparatus (100), the said method comprising the following method steps:
   a. providing at least one flow member (150) in the treatment apparatus (100), the said flow member respectively comprising at least one paddle-like flow element (155);
   b. disposing at least one flow member (150) in the apparatus (100) opposite the surface of the product (W); and
   c. moving the flow member (150) relative and substantially parallel to the surface of the product (W);

characterised to include at least one of the following:
   a. in that each flow element includes a side that faces the surface of the product (W) and that the said side is structured to form a profile of at least one of recesses and holes,
   b. in that the flow member (150) includes at least two flow elements (155) and that the at least two flow elements (155) are located at varying spaces to the surface of the product (W),
   c. in that a flow member (150) is disposed on each side of the plate-shaped product (W) and that the paddle-like flow elements (155) of the flow members (150) on the both sides of the plate-shaped product (W) are offset from one another.

* * * * *